United States Patent
Park et al.

(10) Patent No.: US 9,357,046 B2
(45) Date of Patent: May 31, 2016

(54) DETECTING ELECTROMAGNETIC ENERGY FOR ALARM OR LOG USING MOBILE PHONE DEVICES

(71) Applicant: QUALCOMM Incorporated, San Diego, CA (US)

(72) Inventors: Hee-Jun Park, San Diego, CA (US); Alex Kuang-Hsuan Tu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 276 days.

(21) Appl. No.: 13/792,146

(22) Filed: Mar. 10, 2013

(65) Prior Publication Data

US 2014/0256375 A1     Sep. 11, 2014

(51) Int. Cl.
*H04M 1/24* (2006.01)
*G01R 29/08* (2006.01)
*G01R 31/00* (2006.01)

(52) U.S. Cl.
CPC .............. *H04M 1/24* (2013.01); *G01R 29/0857* (2013.01); *G01R 29/0871* (2013.01); *G01R 31/002* (2013.01)

(58) Field of Classification Search
CPC ...... H04B 5/0062; H04B 5/0068; H04B 5/02; H04M 1/24
See application file for complete search history.

(56) References Cited

U.S. PATENT DOCUMENTS

| | | | |
|---|---|---|---|
| 2006/0052055 A1* | 3/2006 | Rowse | G06K 7/0008 455/41.1 |
| 2007/0298724 A1* | 12/2007 | Sulkowski, Jr. | G01R 29/0814 455/67.13 |
| 2008/0084346 A1* | 4/2008 | Minichshofer | G01S 7/03 342/118 |
| 2010/0125438 A1* | 5/2010 | Audet | G01R 29/0857 702/189 |
| 2011/0151857 A1* | 6/2011 | Park | H04W 48/10 455/422.1 |

FOREIGN PATENT DOCUMENTS

| | | |
|---|---|---|
| EP | 1008856 A1 | 6/2000 |
| FR | 2766320 A1 | 1/1999 |
| WO | WO-2011047377 A2 | 4/2011 |

OTHER PUBLICATIONS

Chuang C.Y., et al., "Monitoring and measuring instrument design of rf electromagnetic fields for human physical and mental health," International Onal Conference on Biomedical and pharmaceutical engineering, ICBPE 2006, Jan. 1, 2006, pp. 237-240, XP031174081, ISBN: 978-978-981-057-4 the whole document.

(Continued)

*Primary Examiner* — Bobbak Safaipour
(74) *Attorney, Agent, or Firm* — Foley & Lardner LLP

(57) ABSTRACT

A mobile phone is configured to employ existing antennae or other exiting input electronics to receive electromagnetic waves, for detection of energy magnitudes. The mobile phone has wireless receiver electronics to receive, through the antennae, communication signals in a plurality of different communication bands that correspond to the plurality of different frequency ranges. Energy levels of electromagnetic waves received through the plurality of antennae are detected. A record is made of energy levels in the plurality of different frequency ranges. An alarm is provided upon a detected energy level crossing a predefined threshold value.

35 Claims, 5 Drawing Sheets

(56) References Cited

OTHER PUBLICATIONS

International Search Report and Written Opinion—PCT/US2014/018791—ISA/EPO—Jun. 13, 2014.

Volski V., et al., "A low cost extension of Spectrum Analysers to Dosimeters," 3rd European conference on Antennas and propagation, EUCAP 2009, Mar. 23-27, 2009—Berlin, Germany, IEEE, Piscataway, NJ, USA, Mar. 23, 2009, pp. 2197-2200, XP031470227, ISBN: 978-1-42444753-4 the whole document.

* cited by examiner

DETECTING ELECTROMAGNETIC ENERGY FOR ALARM OR LOG USING MOBILE PHONE DEVICES

BACKGROUND

1. Field

The disclosure relates generally to systems, devices and processes for detecting energy levels of electromagnetic waves and, in particular embodiments, to electromagnetic wave energy level detection systems and methods that use mobile phone devices and provide alarms and/or logs or other records relating to the detected energy levels.

2. Background

Mobile phones produce electromagnetic waves that can be absorbed by the mobile phone user. In addition, in modern society, people are exposed to electromagnetic wave energy from a variety of environmental sources. Light, microwaves, x-rays, television (TV) and radio transmissions are all examples of electromagnetic waves. Throughout an ordinary day, a typical person in an urban or a city environment may be exposed to electromagnetic waves at various energy levels and frequencies from sources such as, but not limited to, communication signal transmitters, electrical power lines, subway or train power rails, microwave ovens, lights and other household electronics, body and baggage screening systems, MRI, x-ray and other medical systems.

A popular fear is that prolonged exposure to electromagnetic waves or certain types (certain frequencies and energy levels) of such waves can cause adverse biological effects. Accordingly, devices have been proposed for detecting electromagnetic energy in the vicinity of a user. For example, portable monitoring devices such as described in U.S. Pat. No. 7,378,954 to Wendt are configured to be carried by a user and to monitor electromagnetic fields (EMFs) and a variety of potentially hazardous substances in its environment, as the user carries the device. In another example described in U.S. Patent Application Publication No. 2010/0125438, an electromagnetic energy detector is provided in a mobile phone, to be carried by a user.

As it has become popular for users to carry mobile phones in their daily activities and travels, mobile phones configured to detect electromagnetic waves can provide such users with information regarding levels of electromagnetic energy that the users encounter throughout the day. However, the inclusion of specialized electronics for detecting electromagnetic energy within a mobile phone can increase the cost and size of the mobile phone.

SUMMARY

Embodiments of the disclosure relate, generally, to systems, devices and processes for detecting energy levels of electromagnetic waves. Particular embodiments incorporate such electromagnetic wave energy level detection systems and processes in mobile phone devices and provide alarms and/or logs or other records relating to the detected energy levels.

Embodiments of the present disclosure employ certain electronics, such as antennae, existing in the mobile phone (e.g., existing as part of the communication electronics and/or charging electronics in the mobile phone) for use in an electromagnetic wave energy detector. In addition, by employing a combination of two or more existing antennae and other wireless signal input electronics, embodiments of the present disclosure receive electromagnetic energy of a corresponding two or more different frequency ranges. Thus, by using multiple existing antennae or other wireless signal input electronics to receive electromagnetic wave for wave energy detection, the range of the overall detection spectrum of the system can be expanded, while minimizing additional electronics and costs.

A mobile communication device according to an embodiment of the present disclosure includes a plurality of antennae configured to receive signals in a corresponding plurality of different frequency ranges. The mobile communication device also includes wireless receiver electronics configured to receive wireless communication signals through the plurality of antennae, in a plurality of different communication frequency bands that correspond to the plurality of different frequency ranges. The device also includes electromagnetic wave energy level detection electronics configured to detect energy levels of electromagnetic waves received through the plurality of antennae in the plurality of different frequency ranges. The device also includes processor electronics configured to provide at least one of: (a) a record of electromagnetic wave energy levels detected by the electromagnetic wave energy level detection electronics in the plurality of different frequency ranges, and (b) an alarm upon the electromagnetic wave energy levels detected by the electromagnetic wave energy level detection electronics in one or more of the plurality of different frequency ranges crossing a predefined threshold value.

In further embodiments, each antenna is configured to receive signals in a corresponding one of the different frequency ranges that is different from the frequency range for which each other antenna of the plurality of antennae is configured to receive.

In yet further embodiments, the mobile communication device includes additional signal receiving electronics for receiving wireless signals in at least one additional frequency range different from the plurality of different frequency ranges, wherein the electromagnetic wave energy level detection electronics is further configured to detect energy levels of electromagnetic waves in the at least one additional frequency range.

In further embodiments, the additional signal receiving electronics comprises at least one of a charging inductor configured to receive a power charging signal, a microphone and a speaker.

In particular embodiments, the plurality of different communication frequency bands are within the plurality of different frequency ranges.

In particular embodiments, the plurality of different frequency ranges is a plurality of different, non-overlapping frequency bands.

In various embodiments, the wireless receiver electronics is configured to receive wireless telephone communication signals in at least one of the plurality of different communication frequency bands.

In yet further embodiments, the electromagnetic wave energy level detection electronics includes at least one signal path for demodulating electromagnetic wave signals received for energy level detection.

In yet further embodiments, the processor electronics is configured to detect peak values of electromagnetic wave energy levels detected by the electromagnetic wave energy level detecting electronics.

In yet further embodiments, the processor electronics is further configured to compare detected peak values with at least one predefined threshold value.

In yet further embodiments, the processor electronics is further configured to provide an alarm signal upon a detected peak value exceeding a predefined threshold.

In yet further embodiments, the processor electronics is configured to determine an estimate of electromagnetic wave absorption by a user based, at least in part, on levels of electromagnetic waves detected by the electromagnetic wave energy level detection electronics.

In yet further embodiments, the processor electronics is configured to determine the estimate of electromagnetic wave absorption further based, at least in part, on user profile information including at least one of user's age, weight and gender.

In yet further embodiments, the processor electronics is configured to associate detected levels of electromagnetic waves with at least one of the detected locations and the detected times at which those levels of electromagnetic waves are detected.

In yet further embodiments, the mobile communication device includes GPS based location detection electronics for providing location information and wherein the processor electronics is configured to associate detected levels of electromagnetic waves with location information provided by the location detection electronics.

In yet further embodiments, the processor electronics is configured to detect the frequency of the received electromagnetic waves and to compare the detected frequencies with predetermined frequencies of known sources of electromagnetic waves to identify one or more potential sources of the received electromagnetic waves.

Further embodiments are directed to a method of operating a mobile communication device comprising arranging a plurality of antennae to receive communication signals and other electromagnetic waves, the plurality of antennae configured to receive signals in a corresponding plurality of different frequency ranges; receiving wireless communication signals through the plurality of antennae, in a plurality of different communication frequency bands that correspond to the plurality of different frequency ranges; detecting electromagnetic wave energy levels of electromagnetic waves received through the plurality of antennae in the plurality of different frequency ranges; and providing at least one of: (a) a record of electromagnetic wave energy levels detected by the electromagnetic wave energy level detection electronics in the plurality of different frequency ranges, and (b) an alarm upon the electromagnetic wave energy levels detected by the electromagnetic wave energy level detection electronics in one or more of the plurality of different frequency ranges crossing a predefined threshold value.

In further embodiments of the method, each antenna is configured to receive signals in a corresponding one of the different frequency ranges that is different from the frequency range for which each other antenna of the plurality of antennae is configured to receive.

Further embodiments of the method include receiving wireless signals through additional signal receiving electronics not associated with the plurality of antennae, in at least one additional frequency range different from the plurality of different frequency ranges; and detecting energy levels of electromagnetic waves in the at least one additional frequency range.

In particular embodiments of the method, the additional signal receiving electronics comprises at least one of a charging inductor configured to receive a power charging signal, a microphone and a speaker.

In particular embodiments of the method, the plurality of different communication frequency bands are within the plurality of different frequency ranges.

Particular embodiments of the method further include receiving wireless telephone communication signals in at least one of the plurality of different communication frequency bands.

In particular embodiments of the method, detecting electromagnetic wave energy levels comprises detecting peak values of electromagnetic wave energy levels received through the antennae in the plurality of different frequency ranges.

Further embodiments of the method include comparing detected peak values with at least one predefined threshold value.

Further embodiments of the method include providing an alarm signal upon a detected peak value exceeding a predefined threshold.

Yet further embodiments of the method include determining an estimate of electromagnetic wave absorption by a user based, at least in part, on levels of electromagnetic waves detected by the electromagnetic wave energy level detection electronics.

In further embodiments of the method, determining the estimate of electromagnetic wave absorption is based, at least in part, on user profile information including at least one of user's age, weight and gender.

Further embodiments of the method include associating detected levels of electromagnetic waves with at least one of the detected locations and the detected times at which those levels of electromagnetic waves are detected.

Yet further embodiments of the method include providing GPS location information and associating detected levels of electromagnetic waves with the GPS location information.

Yet further embodiments of the method include detecting the frequency of the received electromagnetic waves and comparing the detected frequencies with predetermined frequencies of known sources of electromagnetic waves to identify one or more potential sources of the received electromagnetic waves.

A mobile communication device according to yet a further embodiment of the invention includes a plurality of signal receiving means for receiving signals in a corresponding plurality of different frequency ranges; wireless receiver means for receiving wireless communication signals through the plurality of signal receiving means, in a plurality of different communication frequency bands that correspond to the plurality of different frequency ranges; means for detecting electromagnetic wave energy levels of electromagnetic waves received through the plurality of signal receiving means in the plurality of different frequency ranges; and processor means for providing at least one of: (a) a record of electromagnetic wave energy levels detected by the electromagnetic wave energy level detection electronics in the plurality of different frequency ranges, and (b) an alarm upon the electromagnetic wave energy levels detected by the electromagnetic wave energy level detection electronics in one or more of the plurality of different frequency ranges crossing a predefined threshold value.

In a mobile communication device according to further embodiments, each signal receiving means is for receiving signals in a corresponding one of the different frequency ranges that is different from the frequency range for which each other of the signal receiving means is configured to receive.

In yet further embodiments, the plurality of signal receiving means comprises a plurality of antennae.

In yet further embodiments, the plurality of signal receiving means further comprises at least one of a charging inductor configured to receive a power charging signal, a microphone and a speaker.

Further embodiments relate to a computer program product for use in a mobile phone having a plurality of antennae configured to receive signals in a corresponding plurality of different frequency ranges, and electronics configured to receive wireless communication signals through the plurality of antennae, in a plurality of different communication frequency bands that correspond to the plurality of different frequency ranges, where the computer program product includes a computer-readable storage medium comprising code for: detecting electromagnetic wave energy levels of electromagnetic waves received through the plurality of antennae in the plurality of different frequency ranges; and providing at least one of: (a) a record of electromagnetic wave energy levels detected by the electromagnetic wave energy level detection electronics in the plurality of different frequency ranges, and (b) an alarm upon the electromagnetic wave energy levels detected by the electromagnetic wave energy level detection electronics in one or more of the plurality of different frequency ranges crossing a predefined threshold value.

DETAILED DESCRIPTION

Figure 1:
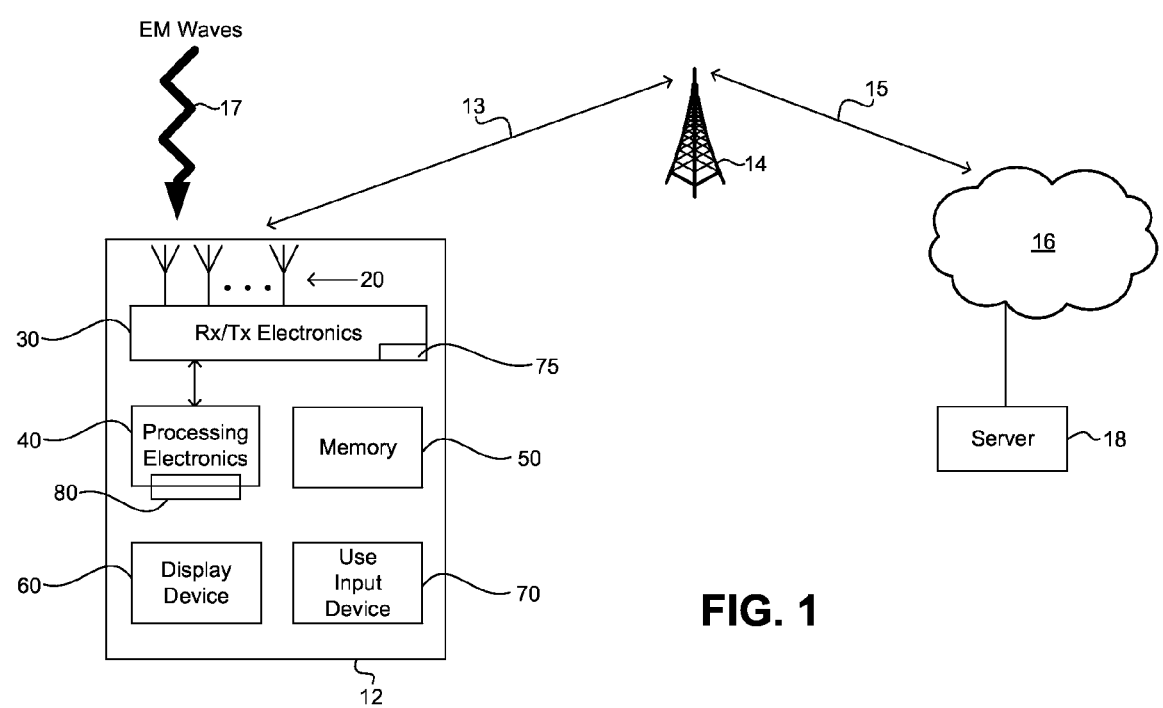
FIG. 1 is schematic diagram of a communication system including a mobile phone device configured for electromagnetic wave energy level detection according to embodiments of the disclosure.

Embodiments of the disclosure relate, generally, to systems and processes for detecting energy levels of electromagnetic waves. Particular embodiments incorporate such electromagnetic wave energy level detection systems and processes in mobile phone devices, and provide alarms and/or logs or other records relating to the detected energy levels.

Example embodiments relate to mobile phone devices and mobile phone configurations that include hardware and software for detecting energy levels of electromagnetic waves in the environment, in addition to the hardware and software employed for telephone and other typical mobile phone operations. Hardware and software for detecting energy levels of electromagnetic waves and related operations may be incorporated in the mobile phone during manufacture of the mobile phone, for example, as part of the original manufacturer's configuration of the mobile phone. In further embodiments, such hardware and software may be added to a mobile phone, after original manufacture of the mobile phone.

Particular embodiments provide alarms when the detected energy levels reach predefined thresholds and/or logs or other records of the detected energy levels. Such embodiments can provide information (for example, warnings, reports, charts and/or alarms) to help the user or others evaluate details regarding the user's exposure to electromagnetic waves. As it becomes more popular for people to carry smart phones in their daily activities and travels, mobile phones configured as described herein can provide information about electromagnetic waves encountered by an individual, a defined group of two or more individuals and/or a larger population throughout their daily activities.

Typical modern mobile phone devices include telephone communication electronics as well as some processor electronics, one or more display devices and a keypad or other user input device. Particular embodiments of the present disclosure are described herein in the context of mobile phones, commonly referred to as smart phones, that have relatively advanced processing, input and display capabilities in addition to telephone communication capabilities. However, further embodiments of the present disclosure may be implemented in any suitable type of mobile phone.

In particular embodiments of the disclosure, some of the hardware existing in the mobile phone for telephone communication and/or other typical mobile phone or smart phone processing operations (referred to herein as "existing" electronics), is also used in the systems and processes for electromagnetic wave energy level detection, logging and related operations. For example, typical smart phone configurations include one or more antennae (often multiple antennae) for receiving various signals of differing frequencies, e.g., frequencies for a global positioning system (GPS) communication, wireless fidelity (WiFi) communication, code division multiple access (CDMA) communication, long term evolution (LTE) communication, frequency modulation (FM) communication, Bluetooth (BT) communication, near field communication (NFC), etc. Some smart phones include other existing electronics configured to receive (or capable of receiving) other types of wireless input signals, such as, but not limited to, charger inductor circuits for receiving a charging input signal for charging a battery, and microphones or speakers for audio input.

Embodiments of the present disclosure employ one or more of those existing antennae and/or other input-receiving electronics for receiving electromagnetic waves to detect (or detect and log) electromagnetic energy levels. In particular embodiments, two or more of those existing antennae or other input receiving electronics are employed for receiving electromagnetic waves of a corresponding two or more different frequency ranges. By employing multiple existing antennae or other input receiving electronics, each configured for receiving different frequency ranges of electromagnetic waves, the energy levels in a relatively wide overall frequency range (spectrum) of electromagnetic waves can be detected and logged.

Further embodiments of the present disclosure employ other existing electronics in smart phones such as, but not limited to: processors and memory circuits for storing and running detection and application programs to provide the functions and operations described herein; display devices and related display electronics for providing visual, audible and/or tactile information to the user; and/or user input devices and related input electronics for receiving user input. Thus, particular embodiments are configured to employ certain existing electronic hardware in the mobile phone in systems and processes for detecting electromagnetic wave energy levels and related operations. However, further embodiments employ dedicated detection electronics (dedicated processor electronics, dedicated memory electronics and/or one or more dedicated antennae that are dedicated to detecting electromagnetic waves) in addition or as an alternative to one or more existing electronics in the mobile phone.

A mobile phone system 10 according to an embodiment of the present disclosure is described with reference to FIG. 1, and includes a mobile phone 12 having communication electronics for telephone communication over a wireless or partially wireless communication network. The wireless communication network includes, for example, one or more cell base stations (one of which is represented at 14 in FIG. 1). Each base station 14 is connected with a core network 16 (telephone and/or wide area network, such as the Internet), directly or through other network devices. For communication operations, the mobile phone 12 is configured to connect to the core network, through the base station 14, for example, via a first communication link 13 between the mobile phone 12 and the base station 14, and a second communication link 15 between the base station 14 and the core network 16. In particular embodiments, the first communication link 13 is a wireless link. The second communication link 15 is a wired link. However, in other embodiments either or both of the links 13 and/or 15 may be wired or wireless (or a combination of wired and wireless links).

The wireless communication network is shown in FIG. 1 in a generalized form, but may include one or more macrocells, microcells, picocells, and/or femtocells and associated cell devices (not shown) and/or other network devices. Alternatively or in addition, the wireless communication network may have other suitable configurations, such as, but not limited to configurations in which one or more mobile phones 12 connect to the core network 16 through other forms of communication links that do not include a base station 14.

More than one mobile phone (including mobile phone 12 and others not shown) may be connected for communication in the system 10 at any given time, for example, through the base station 14 or other base stations (not shown). Accordingly, the system 10 is configured to support a number of users and user devices at any given time. The drawing of FIG. 1 shows one such user device 12.

In FIG. 1, one or more further network communication devices 18, such as a server or other computer, is connected for communication in the system 10. In particular embodiments, one or more of such further network communication devices may be configured to provide operations associated with electromagnetic wave detection, logging and reporting, as described below. The system 10 may include additional user devices and network devices (not shown).

A generalized representation of some of the electronics in the mobile phone 12 is shown in FIG. 1. The electronics in the mobile phone 12 include a plurality of antennae and other input-receiving electronics (represented by antenna 20 in FIG. 1) for receiving communication signals in a corresponding plurality of different frequency ranges, to provide telephone communication and other smart phone functions. As described herein, in addition to communication signals received via link 13 or other communication links, the plurality of antennae 20 are also used to receive electromagnetic waves 17 from the environment (in a corresponding plurality of different frequency ranges) for electromagnetic energy level detection and logging operations. The different frequency ranges may be spaced apart from each other on a frequency scale. Alternatively, one or more of the different frequency ranges may overlap one or more other ones of the frequency ranges.

The electronics in the mobile phone 12 also includes receiver and transceiver electronics 30, processor electronics 40, electronic memory 50, one or more electronic display devices 60 and one or more user input devices 70. The one or more electronic display devices 60 may include any suitable visual display electronics such as, but not limited to liquid crystal display (LCD), light emitting diode (LED), cathode ray tube (CRT), or plasma display devices, or the like. In some embodiments, the user input device 70 comprises a touch-screen input device associated with the one or more display devices 60. In other embodiment, the user input device 70 includes a keypad, buttons or other manual operators.

According to an embodiment of the present disclosure, the mobile phone 12 (including antennae 20, receiving electronics 30, processor electronics 40, memory 50, display devices 60 and input devices 70), is configured to provide telephone communication and typical smart phone functions. In that regard, the receiver/transceiver electronics 30 are connected to the antennae 20, and include appropriate RF (and other) signal paths to receive (via the antennae 20) wireless communication signals in a plurality of different frequency ranges associated with smart phone operations. Such different frequency ranges may include, for example, but not limited to, frequencies associated with one or more of GPS, WiFi, CDMA, LTE, FM, BT, NFC, or the like. In addition, the receiving electronics 30 are further configured to include appropriate RF path circuitry 75 for electromagnetic energy amplitude detection and scanning.

The processor electronics 40 includes one or more processors connected to control the receiver/transceiver electronics 30, in accordance with software stored in memory 50. While the connection is not shown in FIG. 1, the processor electronics 40 is also connected to control the one or more electronic display devices 60 and to receive input information from the one or more user input devices 70. The memory 50 may be any suitable electronic memory including, but not limited to RAM, ROM, EPROM, disc device, or the like.

In addition to telecommunication and other smart phone operations, the mobile phone 12 is further configured to provide electromagnetic wave energy level detection and alarming or logging operations, as described herein. Accordingly, the processor electronics 40 operates with software 80 (programs, routines, data and the like) for providing operations associated with the detection and logging of electromagnetic waves, as described herein. Software 80 may be stored in memory 50 and selectively accessed or retrieved for use by the processor electronics 40. In further embodiments, the processor electronics 40 is configured with firmware, hardware or any combination of software, firmware and hardware to provide operations described herein with respect to the software 80.

The software 80 includes one or more programs, routines, applications or the like for controlling the processor electronics 40 to operate with the receiving electronics 30, in a detection mode. In the detection mode, the mobile phone 12 operates to detect the energy levels of electromagnetic waves received through the plurality of antennae and other input-receiving electronics 20. In particular embodiments, the energy amplitude of the electromagnetic wave is detected for each of a plurality of different frequencies or frequency ranges (overlapping or non-overlapping ranges).

The plurality of antennae and other input-receiving electronics 20 are particularly configured to receive wireless input signals in a corresponding plurality of different frequency ranges, when the mobile phone 12 operates in a communication or charging mode. Accordingly, in embodiments of the present disclosure, those antennae and/or other input receiving electronics 20 are also employed in the detection mode to detect electromagnetic waves in a corresponding plurality of different frequency ranges (corresponding to frequency ranges for which the antennae and other input receiving electronics 20 are particularly configured to receive).

The software 80 controls the processor electronics 40 to record (log) the amount (intensity or magnitude of energy) of the detected electromagnetic waves for each frequency or frequency range. In particular embodiments, energy levels of electromagnetic waves received for each frequency or frequency range associated with each respective antenna is detected and recorded (logged). In further embodiments, the energy levels are detected recorded (logged) for each frequency or frequency range at multiple different instances (periodically, arbitrarily or at predefined times) over a period of time.

In particular embodiments, the processor electronics 40 is configured, via the software 80, to detect an alarm condition with respect to the electromagnetic waves and, in response, provide a user-detectable alarm, such as an audible sound through a speaker (not shown in FIG. 1), visible indicia on the display device 60, vibration or other tactile signal through a tactile output device (not shown), or any combination thereof. Example alarm conditions include a condition in which: (a) the intensity (magnitude of energy) of the detected electromagnetic wave in one of the frequencies or frequency ranges exceeds a predefined threshold value for that frequency or frequency range, (b) the sum of the intensity of multiple electromagnetic wave detections over a period of time exceeds a predefined threshold for a particular frequency, frequency range or for the overall detection range, (c) the intensity of the electromagnetic wave increases suddenly, for example, to a predefined threshold value within a predefined period of time and/or at a rate greater than a predefined threshold rate.

In further embodiments, the software 80 further controls the processor electronics 40 to produce reports, charts, or the like, relating to the detected electromagnetic waves, for display on the display device 60 and/or to communicate via email, text message, fax or other communication feature associated with the mobile phone 12. In particular embodiments, the processor electronics 40 is programmed, via the software 80, to record detection information in correspondence with time and location information (e.g., clock and GPS data), so that detection information is location and time stamped. The detection information can, then, be displayed in various graphs or reports, in association with time and/or location information. The graphs or reports can help a user understand where and when high and low levels of electromagnetic energy were detected (e.g., during the course of the user's day or other period of time). The detection information can be used in algorithms that estimate the users absorption level. Graphs and reports can be generated regarding estimated absorption levels, relative to time and location. Such algorithms can be included in the software 80 and/or may be stored and accessible from other sources, such as server 18.

In addition, the frequency of the received electromagnetic waves can be detected and compared with predetermined frequencies of known sources of electromagnetic waves to identify one or more potential sources of the received electromagnetic waves. For example, a database of frequencies (or other detectable characteristics) of electromagnetic waves from known sources can be stored and accessed by the processor electronics 40. The database may be stored in the memory 50 of the mobile phone 12 and/or may be stored and accessible from other sources, such as server 18.

In particular embodiments, the processor electronics 40 is configured, via the software 80, to compare frequencies (or other characteristics) of received electromagnetic waves with frequencies (or other characteristics) in the database, to identify potential matches. In such embodiments, the processor electronics 40 provides information to the user regarding potential matches, for example, as part of a report or chart discussed above. The database may include information regarding electromagnetic wave frequency (or other characteristics) of known sources of electromagnetic waves (such as subways or other electric rail facilities, high tension power lines, CRT emissions, etc.). In further embodiments, the database can be updated with user-inputted information to help identify other potential sources. In yet further embodiments, processing associated with identifying potential matches is carried out by the server 18, based on detection data (electromagnetic energy levels for each of a plurality of frequency ranges) received from the mobile phone 12.

Figure 2:
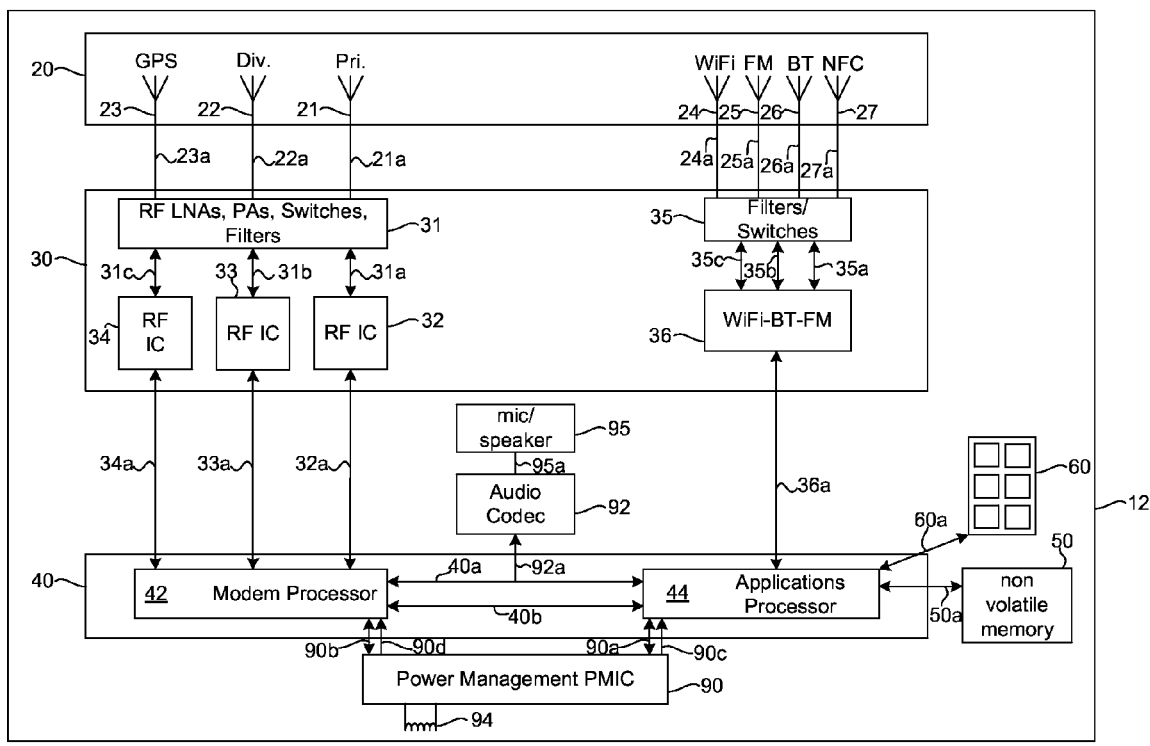
FIG. 2 is a schematic diagram of electronics in a mobile phone device according to embodiments of the disclosure.

A more detailed example representation of an electrical configuration for the mobile phone 12, according to an embodiment of the present disclosure, is described with reference to FIG. 2. The example in FIG. 2 is based on a two-processor configuration, in which the processor electronics 40 includes a modem processor 42 and an applications processor 44. The modem processor 42 handles much of the processing carried out for telephone communication signals, while the applications processor 44 handles much of the processing carried out for displaying information on the display device 60 and processing data for user applications. The modem processor 42 and the applications processor 44 are connected together for communication, shared processing and/or passing data and program instructions, where the connection between those processors is represented by links 40a and 40b. The nonvolatile memory 50 and the display device 60 are connected to the applications processor 44, through connections represented by links 50a and 60a, respectively. An example of a two-processor configuration for a smart phone is Qualcomm's chipset products that employ an applications processor and a modem processor.

While a FIG. 2 shows a two-processor configuration, other embodiments of the present disclosure employ a single processor configuration, in which a single processor performs the operations described herein with respect to the modem processor 42 and the applications processor 44. In yet other embodiments, other suitable processor configurations with one or multiple (two or more) processors are employed.

In the embodiment of FIG. 2, the antennae 20 include a primary antenna 21, a diversity antenna 22 and a GPS antenna 23, each connected to the modem processor, through receiver/transceiver electronics 30. The antennae 20 also include a WiFi antenna 24, an FM antenna 25, a BT antenna 26 and an NFC antenna 27, each connected to the applications modem 44, through further receiver/transceiver electronics 30. Other embodiments of the present disclosure include any suitable combination of the antennae 21-27, and/or yet further antennae, depending upon the features and functions included in the mobile phone.

The primary antenna 21 is employed in receiving and transmitting telephone communication signals during a telephone operation of the mobile phone 12. The diversity antenna 22 is employed in telephone operations to improve communications in certain environments (such as environments with signal reflection noise or other interference). The GPS antenna 23 is connected to GPS receiver electronics (within the receiver electronics 30), which operate with the modem processor 42 to receive and process satellite location signals (GPS signals). The WiFi antenna 24 is employed for connection with local area network (LAN) devices proximate to the mobile phone 12. The FM antenna 25 is employed for FM communications, such as for receiving FM radio signals. The BT antenna 26 is employed for Bluetooth communications. The NFC antenna 27 is employed for near filed communications, such as, but not limited to, communications with credit card readers or the like.

The ability to effectively receive signals of a particular frequency is dependant on various factors relating to the configuration of the antenna, including, for example, the length, shape and other characteristics of the antenna structure. Each of the antennae 21-27 is configured for use with a particular type of communication signal and, thus, a particular signal frequency or frequency range. Table 1, below, shows examples of frequencies and frequency ranges that antennae 21-27 may be configured to receive.

TABLE 1

| Communication Operation | Frequency Range |
| --- | --- |
| NFC (antenna 27) | about 13.56 MHz |
| FM (antenna 25) | 87.5-108 MHz |
| Primary and Diversity | GSM: 450-1,990 MHz |
| (GSM/3G/4G) | 3G: 800-1900 MHz |
| (antennae 21 and 22) | 4G: 700-2100 MHz |
| GPS (antenna 23) | 1176-1575 MHz |
| Bluetooth (antenna 26) | 2400-2480 MHz |
| WiFi (antenna 24) | 2.4, 3.6 and 5 GHz |

The frequency ranges shown in Table 1, above are representative examples of suitable frequency ranges for the antennae 21-27. In further embodiments, one or more (or each) of the antennae 21-27 may be configured for signals in frequency ranges that differ from those shown in table 1.

Each of the antennae 21-27 is connected to the processor electronics 40 (either modem processor 42 or applications processor 44) through receiver/transceiver electronics 30. In the embodiment in FIG. 2, each of the antennae 21, 22 and 23 is connected to the modem processor 42, through receiver/transceiver electronics 30, while each of the antennae 24, 25, 26 and 27 is connected to the applications processor 44, through receiver/transceiver electronics 30. Electrical connections of the antennae 21, 22, 23, 24, 25, 26 and 27 with receiver/transceiver electronics 30 are represented by links 21a, 22a, 23a, 24a, 25a, 26a and 27a, respectively. In further embodiments, two or more of the antennae 21-27 may share a link 21a-27a.

The receiver/transceiver electronics 30 include RF amplifiers, power amplifiers, switches and filters 31, as well as RF ICs 32 and 33 for modulating and demodulating communication signals during, for example, a telephone communication operation of the mobile phone 12. The RF ICs 32 and 33 (with the amplifiers, switches and filters 31) provide signal paths between the antennae 21, 22 and 23, respectively, and the modem processor 42, for example, during telephone or GPS communication operations. In particular embodiments, such signal paths are configured similar to those employed in typical telephone signal communications (for telephone signals communicated via antennae 21 and 22) and typical GPS signal receptions (for GPS signals received via antenna 23).

In one embodiment of the present disclosure, one or both of the RF ICs 32 and 33 (with the amplifiers, switches and filters 31) provides one or more further signal paths between each of the antennae 21, 22 and 23 and the modem processor 42, for demodulating electromagnetic waves for detecting the intensity level (energy magnitude) of the electromagnetic wave, for each of a plurality of frequencies or frequency ranges. Alternatively or in addition, at least one additional RF IC 34 is included to provide (with the amplifiers, switches and filters 31) the one or more further signal paths between the antennae 21, 22 and 23 and the modem processor 42, for demodulating electromagnetic wave signals received by the antennae 21, 22 and 23, to detect electromagnetic wave intensity (energy magnitude) for each of a plurality of different frequency ranges. The one or more further signal paths include filter circuits tuned for electromagnetic waves, so that the magnitude of the electromagnetic energy received through the antennae 21, 22 and 23 can be detected by the modem processor 42, for each frequency range of a plurality of frequency ranges received through the antennae 21, 22 and 23.

Figure 3:
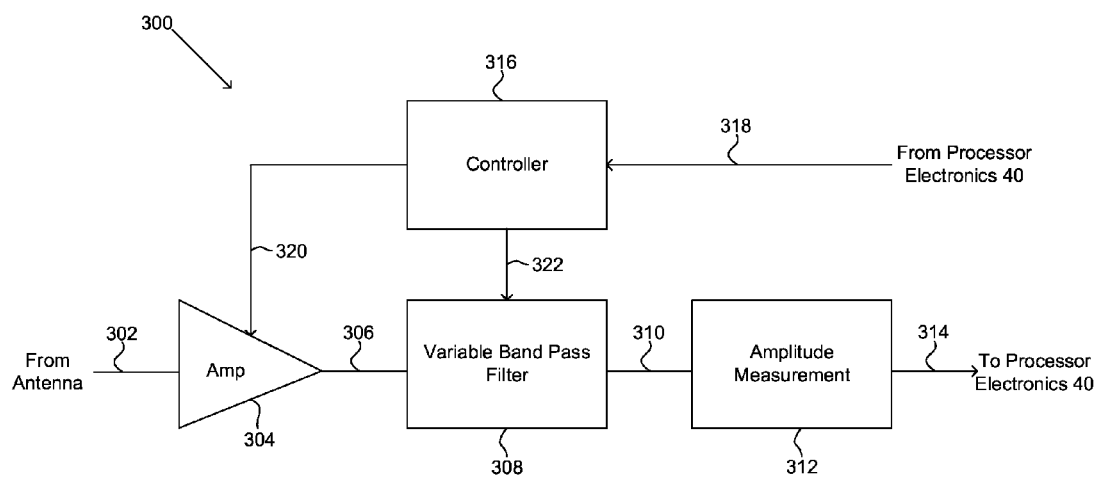
FIG. 3 is a schematic diagram of a signal path for electromagnetic wave energy level detection in receiver electronics of a mobile phone according to embodiments of the disclosure.

An example of a further signal path 300 (for electromagnetic wave energy level demodulation and detection) in one or more of the RF ICs 32, 33 and 34 is shown in FIG. 3. In the embodiment in FIG. 3, the further signal path includes an input line 302 from one or more of the antennas 21, 22 and 23, for electromagnetic wave signals received via the antennas 21, 22 and 23. The input path 302 connects to an input of an amplifier 304 (such as a variable gain amplifier). The output of the amplifier 304 is connected, via link 306, to the input of a band pass filter 308 (such as a variable band pass filter). The output of the band pass filter 308 is connected, via link 310, to the input of amplitude measurement electronics 312. The amplitude measurement electronics 312 provides an output signal on output line 314, representing the amplitude of a signal that is input to the amplitude measurement electronics 312. The output line 314 from the amplitude measurement electronics 312 is connected to the processor electronics 40, to provide signals representing electromagnetic energy amplitude measurements to the processor electronics 40.

The further signal path 300 in FIG. 3 also includes a controller 316 connected to one or both of the amplifier 304 and the band pass filter 308. The controller 316 comprises any suitable control electronics that receives input signals (via line 318) from the processor electronics 40 and, in response to such input signals, provides control signals to one or both of the amplifier 304 and the band pass filter 308, via control signal lines 320 and 322, respectively. In particular embodiments, the band pass filter 308 is a variable band pass filter that is controlled to select particular frequency bands to pass, in response to control signals provided on control line 322. In such embodiments, the input line 302 may be connected (e.g., through a multiplexer or other switching electronics) to two or more (or all) of the antennae 21, 22 and 23, in a manner such that each antenna 21, 22 or 23 may be selectively and individually connected to the input line 302, one at a time, for conveying electromagnetic energy signals received via the connected antenna 21, 22 or 23 to the further signal path 300. In this manner, amplitude measurements (from amplitude measurement electronics 312) for signals received via antennae 21, 22 and 23 are selectively and individually provided to the processor electronics 40, as the multiplexer or other switching electronics selectively and individually connects each antenna 21, 22 and 23 to the further signal path 300.

Furthermore, the variable band pass filter 308 and/or the variable amplifier 304 are controlled (in response to control signals on line 318 from the processor electronics 40) to be selectively tuned to accommodate electromagnetic waves in the frequency ranges associated with each antenna 21, 22 and 23, as the multiplexer or other switching electronics selectively and individually connects each antenna 21, 22 and 23 to the further signal path 300. Accordingly, the frequency range of the variable band pass filter 308 is varied to correspond to the frequency range of each antenna 21, 22 and 23, respectively, as each antenna 21, 22 and 23 is selectively connected to the further signal path 300.

Thus, when antenna 21 is connected to the further signal path 300 (via the multiplexer or other switching electronics discussed above), the processor 40 provides signals on line 318 to control the controller electronics 316 to tune the further signal path 300 to measure electromagnetic wave energy in the frequency range associated with the antenna 21. The controller electronics 316 tunes the further signal path 300 by providing suitable control signals on one or both of lines 320 and 322 to select the band of the variable band pass filter 308 and the gain of the amplifier 304, to accommodate the frequency range associated with the antenna 21. Similarly, when the antenna 22 is connected to the further signal path 300 (via the multiplexer or other switching electronics discussed above), the processor provides signals on line 318 to control the controller electronics 316 to tune the further signal path 300 to measure electromagnetic wave energy in the frequency range associated with antenna 22. Similar operations are carried out for connection of the antenna 23 to the further signal path 300.

In this manner, amplitude measurements of electromagnetic waves in the various frequency ranges associated with the antennas 21, 22 and 23 are obtained and provided to the processor electronics 40. In other embodiments, multiple further signal paths 300 may be employed (for example, a separate signal path 300 for each separate antenna 21-23, or a shared signal path 300 for some, but not all of the antennae 21-23). In yet other embodiments, other suitable procedures for measuring electromagnetic wave energy levels may be employed as an alternative or in addition to the use of one or more further signal paths 300.

As discussed above, in particular embodiments, the further signal path(s) 300 (e.g., the further signal path(s) in RF ICs 32 or 33 or the further signal path(s) RF IC 34) includes a multiplexer or switch configuration (not shown) that, under control of the processor electronics 40, selectively and individually connects each of the antennae 21, 22 and 23 to receiver electronics in the associated RF IC (or other signal path), for demodulation of a received electromagnetic wave. In further embodiments, the multiplexer or switch configuration is included in the RF amplifiers, power amplifiers, switches and filters 31. The multiplexer may operate, under control of the processor electronics 40, to scan through the antennae 21, 22 and 23, to connect each antenna, one at a time, to the receiver electronics and/or the modem processor 42, for electromagnetic wave detection operations. Connections between the amplifiers, switches and filters 31 and the RF ICs 32, 33 and 34 are represented by links 31a, 31b and 31c, respectively. Connections between the RF ICs 32, 33 and 34 and the processor electronics 40 (e.g., the modem processor 42) are represented by links 32a, 33a and 34a, respectively.

The receiver/transceiver electronics 30 include filters and switches 35 and a WiFi-BT-FM chip 36 between the antennae 24-27 and the applications processor 44, for WiFi, FM, Bluetooth, and NFC signals. The WiFi-BT-FM chip 36 includes electronics configured to provide receiver signal paths for WiFi, BT, FM and NFC signals received through the antennae 24-27.

The filters and switches 35 and the WiFi-BT-FM chip 36 provides signal paths between the antennae 24-27 and the applications processor 44, for example, during WiFi, FM, BT or NFC communication operations. In particular embodiments, such signal paths are configured similar to those employed in typical WiFi, FM, BT or NFC signal communications electronics.

One or more further signal paths (e.g., similar to the further signal path(s) 300 discussed above) are provided between the antennae 24-27 and the applications processor 44 (for example, provided in one or more of the filters and switches 35 and the WiFi-BT-FM chip 36). Such further signal paths are provided for demodulating electromagnetic waves to detect the intensity level (energy magnitude), for each of a plurality of frequency ranges associated with antennae 24-27. Accordingly, at least one of the RF-IC 34, filters and switches 35, and/or the WiFi-BT-FM chip 36 includes a further signal path (300) or other suitable circuits tuned for electromagnetic waves, so that the magnitude of the electromagnetic energy received through the antennae 24-27 can be detected by the applications processor 44, for each frequency range of a plurality of frequency ranges received through the antennae 24-27. In the embodiment of FIG. 2, connections between the filters and switches 35 and the WiFi-BT-FM chip 36 are represented by separate links 35a, 35b and 35c, respectively, for example, to minimize RF noise interference. Connections between the WiFi-BT-FM chip 36 and the processor electronics 40 (e.g., the applications processor 44) are represented by link 36a.

In addition to or as an alternative to receiving electromagnetic wave signals through the antennae 21-27, for detection of the magnitude of electromagnetic energy in frequency ranges associated with those antennae, further embodiments employ other input receiving electronics for receiving electromagnetic wave signals for magnitude detection. Such other input receiving electronics are any electronics configured for or capable of receiving wireless electromagnetic waves, including, for example, one or more of wireless charging electronics, audio microphones and audio speakers, or other devices with inductors and/or other electronics capable of receiving wireless electromagnetic waves.

For example, in the embodiment of FIG. 2, the mobile phone 12 includes a power management integrated circuit (PMIC) 90 connected to a power storage device, such as a battery (not shown), for providing electrical power to and managing electrical power for components of the mobile phone 12, including the processor electronics 40 (modem processor 42 and applications processor 44). In particular embodiments, the PMIC 90 is also connected to provide and control electrical power for the receiver/transceiver electronics 30, the memory 50, the display device 60 and an audio codec 92.

Connections between the PMIC and the processor electronics 40 includes one or more control signal lines 90a and 90b between the PMIC 90 and the processors 42 and 44, as well as one or more power signal lines 90c and 90d between the PMIC 90 and the processors 42 and 44. Control signals and related communications between the processor electronics 40 and the PMIC 90 are provided on the control signal lines 90c and 90d. Power signals for providing power to the processor electronics 40 are provided on power signal lines 90c and 90d.

The PMIC 90 includes one or more inductors or other wireless signal receiving electronics (represented by inductor 94) for receiving a charging signal for charging a battery or other electrical power storage device (not shown). In particular embodiments of the present disclosure, the inductor 94 of the PMIC 90 is employed to receive electromagnetic waves for detection of energy magnitude in a frequency range associated with the inductor 94. Accordingly, the inductor 94 can receive electromagnetic waves in at least one frequency range that is different from the frequency ranges of the electromagnetic waves received through the antennae 21-27. In that regard, the PMIC 90 includes filter circuits tuned for electromagnetic waves, so that the magnitude of the electromagnetic energy received through the inductor 94 can be detected by the modem processor 42 or the applications processor 44, for the frequency range received through the inductor 94.

In addition, further inductors associated with a microphone and/or speaker 95 in the mobile phone 12 is employed to receive electromagnetic waves for detection of energy magnitude in a frequency range associated with the inductor of the microphone and/or speaker 95. Accordingly, the inductor of the microphone and/or speaker can receive electromagnetic waves in at least one frequency range that is different from the frequency ranges of the electromagnetic waves received through the antennae 21-27. In that regard, the audio codec 92 includes filter circuits tuned for electromagnetic waves, so that the magnitude of the electromagnetic energy received through the inductor of the microphone and/or speaker can be detected by the modem processor 42 or the applications processor 44, for the frequency range received through that inductor. Electrical connection of the microphone and speaker 95 with the audio codec 92 is represented by link 95a. Similarly, electrical connection of the processor electronics 40 with the audio codec 92 is represented by link 92a.

The audio codec 92 includes suitable demodulation circuitry for demodulating audio signals for processing by the processors 42 and 44. According to particular embodiments of the disclosure, the demodulation circuitry in the audio codec 92 is used as a peak detector, to detect the peak levels of electromagnetic waves received by the inductor of the microphone and/or speaker 95. The audio codec 92 is controlled (via software 80 or other software, hardware, firmware or combinations thereof associated specifically with the audio codec 92) to provide audio signal operations, such as typical audio processing when the mobile phone 12 is operating in a communications mode, and to detect peak levels of low frequency electromagnetic wave when the mobile phone is operating in a detection mode.

In particular embodiments, the charging inductor 94 and the microphone and speaker inductor 95 (and/or other further input receiving electronics) receive input electromagnetic wave signals in frequencies or frequency ranges that are different from the frequencies or frequency ranges for which the antennae 21-27 are configured to receive. For example, a typical microphone or speaker inductor (e.g. for microphone and speaker 95) may receive electromagnetic wave signals in a frequency range of about 20 Hz-20 kHz. A typical wireless charger inductor (e.g., inductor 94) may receive electromagnetic wave signals in a frequency range of about 20 kHz to 10 MHz.

Thus, by detecting electromagnetic waves in frequency ranges of the other input receiving electronics (such as charging inductors and microphone and speaker inductors), along with the electromagnetic waves in frequencies and frequency ranges shown in Table 1 for antennae 21-27, the overall detection range can be relatively large as compared to the use of a single existing antenna for detection. For the example frequency ranges in Table 1 and in the above paragraph, the overall detection range for the system can be from 20 Hz to 2480 MHz and from 2.4 to 5 GHz (with some gaps).

As described herein, the processor electronics 40 (including modem processor 42 and applications processor 44) are configured to operate in a detection mode to detect (or detect and log) energy levels of electromagnetic waves in the frequencies and frequency ranges received by the antennae 21-27 and/or other input receiving electronics, and to operate in a communication mode to perform standard telephone and smart phone functions and operations. The processor electronics 40 may be configured to carry out detection mode operations periodically or at any predefined or pseudorandom intervals (for example, when not in the communication mode, or in the background while in the communication mode). In particular embodiments, each detection mode operation involves one or more detection of samples of energy levels of electromagnetic waves in frequencies received from one or more of the antennae 21-27 and other input receiving electronics.

Figures 4, 5, 6:
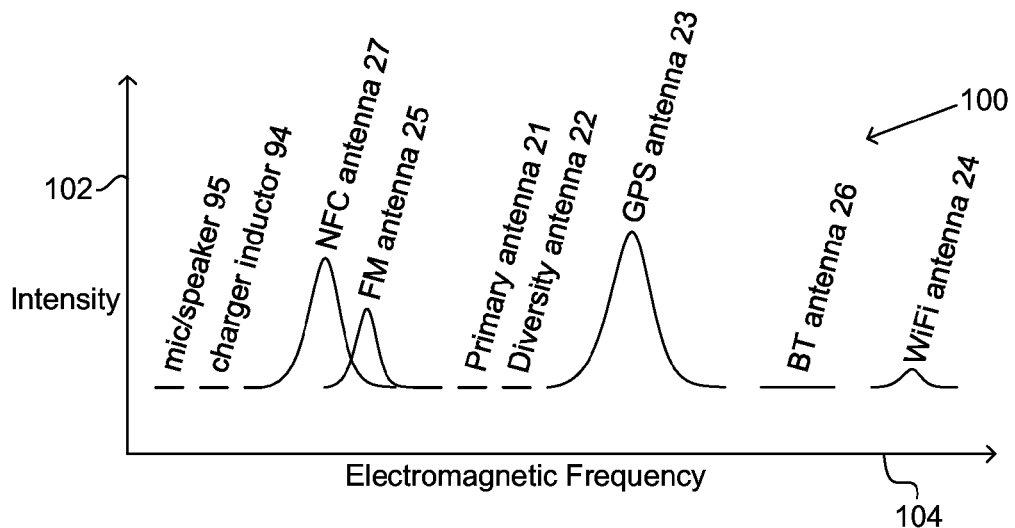
FIG. 4 is a graph plotting a representative example of the electromagnetic energy level across a detection frequency spectrum, as detected by a mobile phone configured according to embodiments of the disclosure.
FIG. 5 is a schematic diagram of processing of detected levels of electromagnetic energy for each of a plurality of frequency ranges within the detection frequency spectrum, according to embodiments of the disclosure.
FIG. 6 is a graph plotting the representative example of the detected electromagnetic energy level of FIG. 4, after the processing of FIG. 5.

Thus, using the overall detection range (frequency spectrum) of the combination of all of the antennae 21-27 shown in Table 1 and the additional frequency ranges provided by the charging inductor 94 and microphone and speaker 94 discussed above, the processor electronics 40 detects an electromagnetic energy level over a relatively large overall detection range (as compared to the frequency range of a single existing antenna). FIG. 4 shows an illustrative example of a plot 100 of the electromagnetic energy levels that could be received (and detected) over that overall detection range (frequency spectrum), in a given detection operation.

The illustrative example in FIG. 4 shows the intensity (or energy magnitude) of electromagnetic waves received and detected through each antenna 21-27 and other input receiving device 94 and 95 in a given detection sample. Multiple samples may be detected over a period of time, for example, to plot or report on a rate and/or an accumulated amount of electromagnetic wave energy detected over that period of time. The energy magnitude is shown on the vertical axis 102 of the plot 100, while the frequency is shown on the horizontal axis 104 of the plot 100. The energy level of electromagnetic energy as received by each antenna and inductor is shown as part of the overall frequency spectrum, where each portion of the detected spectrum is labeled in FIG. 4 with the reference character corresponding to the antenna or other input receiving device through which that portion of the detected spectrum was received. The illustrative example of FIG. 4 shows a nominal level of electromagnetic energy being received and detected via antennae 21, 22 and 26 and devices 94 and 95, while a greater-than-nominal level is being received and detected via antennae 23, 24, 25 and 27 (where the intensity of the electromagnetic wave energy received via antennae 23, 25 and 27 is greater than the threshold value 126.

In particular embodiments, the processor electronics 40 is configured to record information, such as logs of detected levels of electromagnetic waves. In further embodiments, the processor electronics 40 is configured to provide reports, displays, warnings, alarms or other user-perceptible information relating to the detected levels of electromagnetic waves. For example, a report or display may show a plot of electromagnetic wave energy levels and frequencies, similar to that shown in FIG. 4.

In further embodiments, the processor electronics 40 is also configured to minimize or eliminate gaps in the frequency spectrum (e.g., gaps shown in FIG. 3 between edges of the portions of the spectrum covered by the individual antennae and inductors). For example, as shown in FIG. 5, the processor electronics 40 may be configured to apply a suitable compensation function 110 to data 112 received via the antennae 21-27 and other input receiving electronics 94 and 95, to smooth out the plot and fill in the gaps. A cut off function 114 may also be applied, to define a particular range (overlapping or non-overlapping with other ranges) on the frequency spectrum 104 (FIG. 4) for each antenna 21-27 and other input receiving electronics. After applying the compensation function 110 and cut off function 114, the data 112 becomes compensated (or enhanced) data 116. In particular embodiments, the compensated (or enhanced) data 116 can be plotted (and included in reports and/or visual displays) in an enhanced plot that is easier to analyze and/or comprehend than the plot of FIG. 4.

FIG. 6 shows an example of an enhanced plot 120 that is based on the data in plot 100 of FIG. 4, but where the data is processed according to the compensation and cut off functions of FIG. 5. Similar to FIG. 4, in the plot of FIG. 6, the energy magnitude is shown on the vertical axis 122 of the plot 120, while the frequency is shown on the horizontal axis 124 of the plot 120. However, unlike the plot 100 in FIG. 4, the plot 120 in FIG. 6 is continuous across the detection frequency spectrum. The plot 120 in FIG. 6 may be displayed on the display device 60, transmitted to another person or entity (e.g., using telephone, email, text messaging, fax or other communication capabilities of the mobile phone 12) or used in other manners.

For example, the plot 120 may be used to compare received and detected electromagnetic energy levels across the detection frequency spectrum with a predefined threshold value 126. In particular embodiments, a threshold value 126 may be displayed, along with the plot 120, for example as shown in FIG. 6, as a horizontal line at a predefined intensity (magnitude) level of the vertical axis 122. In further embodiments, other suitable indicia 128 for identifying a predefined threshold and/or detected energy levels that exceed a predefined threshold are used in the display.

Thus, as described above, the processor electronics 40 may be configured to apply a suitable compensation function 110 to fill in gaps shown in FIG. 4, between detected frequency ranges in the overall frequency spectrum. In further embodiments, such gaps in the frequency spectrum are filled in other suitable manners. For example, in such further embodiments, the antennae 21-27, the charging inductor 94 and/or the inductor of the microphone or speaker 95 are configured to expand or shift the frequency range shown in Table 1 or the above paragraph, to fill in some or all of the gaps. In yet further embodiments, one or more additional antennae is provided, where the one or more additional antennae are configured to receive electromagnetic waves in frequency ranges that fill in some or all of the gaps. In yet further embodiments, any combination of particularly configured antennae, additional antennae and/or compensation functions are employed to fill in gaps in the detected frequency spectrum.

In particular embodiments, electromagnetic wave detection, compensation, analysis and display functions of the processor electronics 40 is controlled via software and data stored in the non-volatile memory 50. One or both of the processors 42 and 44 may be employed to carry out various processing functions associated with the detection, compensation, analysis and display operations described herein. For example, in one embodiment, the modem processor 42 is configured, via software 80, to obtain and/or collect data associated with the spectrum chart of FIG. 4, for all frequency ranges covered by the multiple antennae 21-23 and other input receiving electronics connected with the modem processor 42. In such an embodiment, the applications processor 44 is configured, via software 80, to obtain and/or collect data associated with the spectrum chart of FIG. 4, for all frequency ranges covered by the multiple antenna 24-27 and other input receiving electronics connected with the applications processor 42. In addition, the applications processor 44 is further configured, via software 80, to estimate the electromagnetic emissions generated by the mobile phone 12, itself, for inclusion in the detection frequency spectrum of FIG. 4 (or in the analysis of the detection frequency spectrum).

In particular embodiments, the applications processor 44 and/or the PMIC 90 are configured, via software 80, to implement a low power operation function to reduce battery power consumption, upon detection of a predefined event, such as, but not limited to, the detection of motion above or below a predefined level (via GPS signal reception, an accelerometer a pedometer or the like) and/or the stored level of power in the battery of the mobile phone 12 reaching a pre-defined threshold (e.g., a low level threshold). The low power operation function may reduce battery power consumption by, for example, inhibiting operation of certain power-consuming unnecessary functions.

In particular embodiments, the software can control the processor electronics 40 to detect whether or not electromagnetic energy received by one or more of the antennae 21-27 and/or other input receiving electronics (such as the PMIC inductor 94 and/or the inductor of the microphone or speaker 95) exceeds predefined threshold values. Predefined threshold values are stored in the memory 50. For example, the level of the received electromagnetic energy is compared to a predefined level threshold to determine if the instantaneous detected level exceeds the threshold. The processor electronics 40 are configured to provide an alarm (through the display device 60 and/or the speaker 95), when the detected instantaneous level of the electromagnetic energy exceeds the threshold.

Alternatively or in addition, the amount of electromagnetic energy absorbed by the user over a period of time can be estimated, using an estimation algorithm that takes into account the levels of electromagnetic energy detected over that period of time. The estimation algorithm can take into account other factors, including, user profile data that has been input by the user through a user input device (e.g., 70 in FIG. 1). Such user profile data may include one or more of the user's age, weight, gender, state of pregnancy, and/or other factors that can be relevant to electromagnetic energy absorption or the effect of such absorption. In such embodiments, the threshold level(s) for determining whether or not to issue an alarm, warning or other information (such as threshold level 126 in FIG. 5) is dependent, at least in part, on the user profile data (such that different threshold values are provided for users with different profile data).

The estimation algorithm can also take into account an estimate of the electromagnetic wave from the user's phone itself, separately from the environment. In such embodiments, the processor electronics 40 is configured, via software 80, to estimate amounts of the user's absorption of electromagnetic waves that are produced by the mobile phone 12 itself, based on factors relating to the usage of the mobile phone 12 (such as, but not limited to, one or more of the period of time of usage, signal frequency and modes of usage, distance of phone from user's body as measured by a camera or proximity detector). Such estimates may be for the total amount of electromagnetic energy absorbed, or a total amount absorbed per predefined time period (such as, but not limited to an hour or a day). Thus, in particular embodiments, the processor electronics 40 is configured, via software 80, to detect levels of received electromagnetic waves, use an algorithm to estimate electromagnetic absorption by user (per hour, day, etc.), where the algorithm employs user profile information (age, weight, gender, pregnancy state, etc.), and causes an alarm, warning or other information to be generated and/or displayed when absorption levels exceed predefined thresholds.

In particular embodiments, the processor electronics 40 (such as the applications processor 44) is programmed or otherwise configured to generate reports and charts relating to the detection. In particular embodiments, the applications processor 44 is programmed to record detection information in correspondence with time and location information (e.g., clock and GPS data), to associate a location and time record (or stamp) with each detected level of electromagnetic wave energy.

In addition, the processor electronics 40 is programmed to display the detection information in one or more of various graphs or reports, in association with time and/or location information. For example, the processor electronics 40 may be programmed to display a list of available types or styles of graphs or reports, in a manner that allows the user to select one or more of the listed types or styles. The processor electronics 40 is further programmed to receive user input regarding the selection of a listed type or style of graph or report, where such user input may be received, for example, through the user input device 70. The processor electronics 40 is yet further programmed to respond to a user input of a selection of a type or style of graph or report, to generate the selected type or style of graph or report, using data obtained from electromagnetic wave detection operations as described herein.

The graphs or reports can help a user understand where and when high and low levels of electromagnetic energy were detected (e.g., during the course of the user's day or other period of time). The detection information can be used in algorithms that estimate the users absorption level as discussed above. Graphs and reports can be generated regarding estimated absorption levels, relative to time and location.

In addition, the frequency of the received electromagnetic waves can be detected and compared with predetermined frequencies of known sources of electromagnetic waves to identify one or more potential sources of the received electromagnetic waves. For example, a database of frequencies (or other detectable characteristics) of electromagnetic waves from known sources can be stored and accessed by the applications processor 12. The applications processor 12 compares frequencies (or other characteristics) of received electromagnetic waves with frequencies (or other characteristics) in the database, to identify potential matches. The applications processor 12 provides information to the user regarding potential matches, for example, as part of a report or chart discussed above. The database may include known sources of electromagnetic waves (such as subways or other electric rail facilities, high tension power lines, CRT emissions, etc.). The database can be updated with user-inputted information to help identify other potential sources.

Various processes may be employed for carrying out the operations described herein, according to embodiments of the present disclosure. An example process 200 is described with reference to FIG. 7. However, other embodiments employ other suitable processes.

Figure 7:
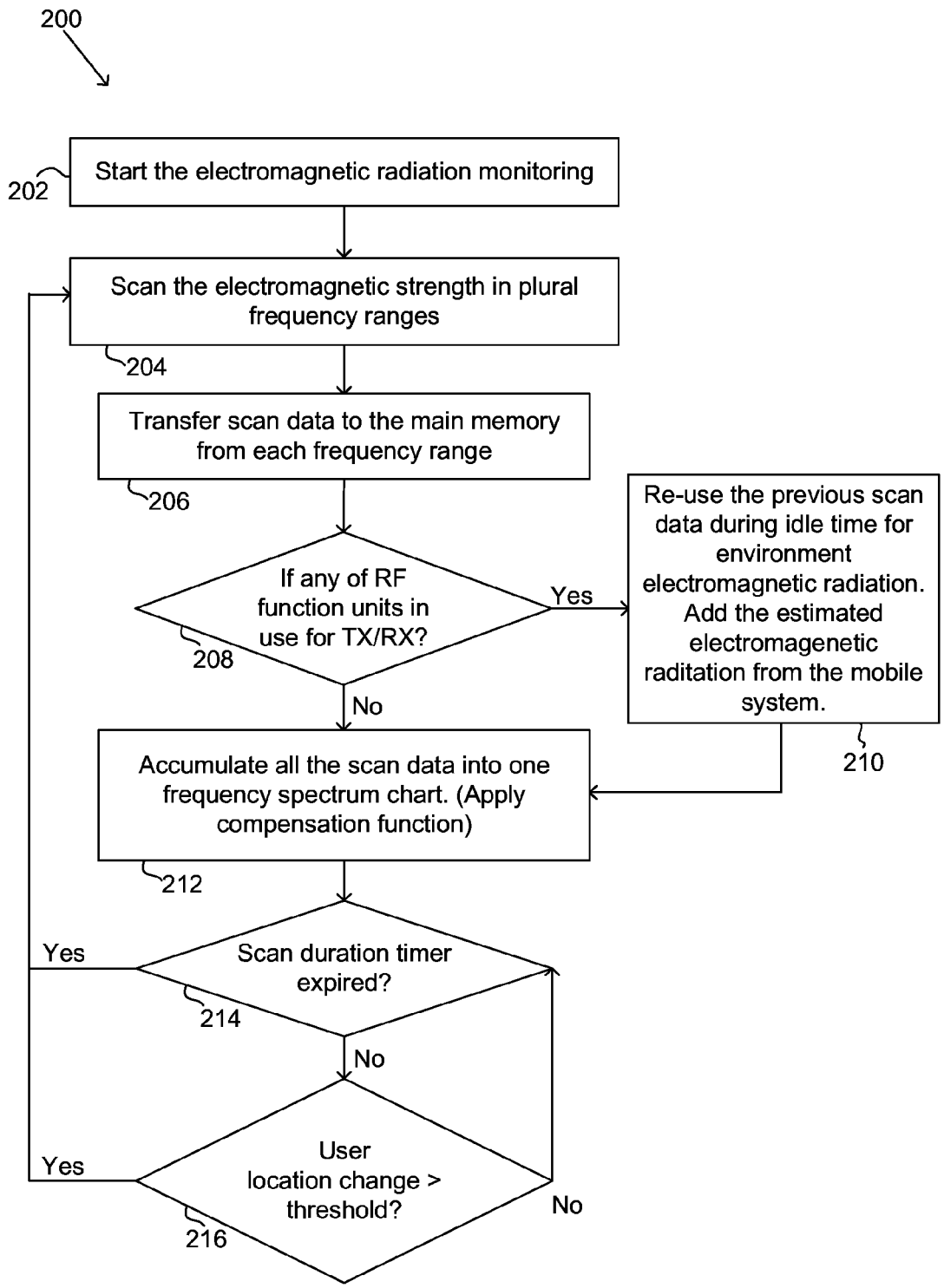
FIG. 7 is a flow chart of a process for detecting electromagnetic wave energy levels according to embodiments of the disclosure.

With reference to FIG. 7, a process 200 starts with the start of electromagnetic radiation monitoring procedure 202. Upon starting the procedure at 202, the processor electronics 40 turn on RF front end circuitry and antennas and other input electronics, and scans the signal paths for each of a plurality of antennas and other input electronics (as shown at 204). The signal paths for the antennas and other input electronics are scanned to detect and obtain information regarding the intensity (magnitude) of the electromagnetic wave energy received by each of the antennas and other input electronics. As shown at 206, the scan data (information regarding the detected intensity of the electromagnetic wave energy) is transferred to the memory 50 (and/or to memory associated with the server 18), for each antenna and other input electronics.

At 208, the processor electronics 40 is further configured to determine whether any of the antennas or other input electronics is being used for communication operations (transmitting or receiving telephone signals or other communication signals). If the antennas or other input electronics are being used for communication operations (Yes at 208), then, at 210, the processor electronics 40 (and/or processor electronics associated with the server 18) re-uses previous scan data as an estimate of environmental electromagnetic radiation and adds an estimated amount of further electromagnetic radiation generated by the mobile phone 12 in performing the communication operations. After determining the estimated radiation (at 210), or upon a determination at 208 that the antennas or other input electronics are not being used for communication operations (No at 208), then, at 212, the processor electronics 40 (and/or processor electronics associated with the server 18) accumulates all of the scan data into one frequency spectrum chart, as described above with reference to FIGS. 4 and 6.

Upon accumulating the scan data (at 212), the processor electronics 40 determines, at 214, whether or not a scan duration timer has expired. The scan duration timer expires when all of the antennas and other input receiving electronics have been scanned for electromagnetic wave energy. If the scan duration timer has expired (Yes at 214), then the process returns to procedure 204. If, on the other hand, the scan duration timer has not expired (No at 214), then a determination is made, at 216, of whether or not the user's location has changed by an amount that exceeds a predefined threshold (for example, by determining whether GPS signals indicate a change in location or a rate of change in location that exceeds a predefined threshold, determining whether the output of an accelerometer, pedometer or other motion or location detecting device within the mobile phone 12 outputs a signal indicating a change in motion or location or a rate of change that exceeds a predefined threshold). If the motion/location change data obtained at 216 exceeds a predefined threshold indicating a change in motion or location by at least a predefined amount or rate (Yes at 216), then the process returns to procedure 204. If, on the other hand, the motion/location change data obtained at 216 does not exceed the predefined threshold (No at 216), then the process returns to procedure 214. The process continues, while the mobile phone 12 remains turned on.

In embodiments described above, examples of a plurality of signal receiving means for receiving signals in a corresponding plurality of different frequency ranges includes any suitable combination of the plurality of antennae 21-27, the charging inductor 94 and the microphone and speaker 95. In other embodiments, such signal receiving means includes other suitable electronics configured to receive wireless electromagnetic wave energy. In addition, example embodiments of wireless receiver means for receiving wireless communication signals through the plurality of signal receiving means, in a plurality of different communication frequency bands that correspond to the plurality of different frequency ranges include receiver electronics 30 or any suitable portion thereof. In addition, example embodiments of means for detecting electromagnetic wave energy levels of electromagnetic waves received through the plurality of signal receiving means in the plurality of different frequency ranges include a signal path through one or more of the RF ICs 32, 33, 34, the WiFi-BT-FM chip 36, amplifiers, filters and switches 31 or 35, electronics as shown in FIG. 3, and/or the processor electronics 30. Example embodiments of processor means for providing at least one of: (a) a record of electromagnetic wave energy levels detected by the electromagnetic wave energy level detection electronics in the plurality of different frequency ranges, and (b) an alarm upon the electromagnetic wave energy levels detected by the electromagnetic wave energy level detection electronics in one or more of the plurality of different frequency ranges crossing a predefined threshold value, include processor electronics 40.

The word "example" or "exemplary" is used herein to mean "serving as an example, instance, or illustration." Any embodiment described herein as "exemplary" is not necessarily to be construed as preferred or advantageous over other embodiments. The techniques described herein may be used for various wireless communication networks such as Code Division Multiple Access (CDMA) networks, Time Division Multiple Access (TDMA) networks, Frequency Division Multiple Access (FDMA) networks, Orthogonal Frequency Division Multiplexing (OFDM) networks, Single-Carrier FDMA (SCFDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR) TD-SCDMA. cdma2000 covers IS-2000, IS-95, and IS-856 standards. A TDMA network may implement a radio technology such as Global System for Mobile Communications (GSM). An OFDM network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is an advanced release of UMTS that uses E-UTRA. UTRA, E-UTRA, GSM, UMTS, and LTE are described in documents from an organization named "3rd Generation Partnership Project" (3GPP). cdma2000 is described in documents from an organization named "3rd Generation Partnership Project 2" (3GPP2). These various radio technologies and standards are known in the art.

The disclosure has been described above based on example embodiments. However, the disclosure need not be limited in any particular manner to the embodiments described above, and various improvements and changes can be made without departing from the subject matter of the disclosure.

For example, embodiments described above with reference to FIG. 2 include a plurality of existing antennae 21-27 and other existing input receiving electronics (such as the charging inductor 94 and/or an inductor of a microphone or speaker 95) for receiving electromagnetic wave signals in a plurality of different frequency ranges. However, other embodiments may employ only one of the existing antennae or existing input receiving electronics, in combination with one or more added dedicated antenna or input receiving electronics (dedicated to electromagnetic wave energy level detection operations). Yet other embodiments may employ a plurality of existing antennae and/or existing input receiving electronics, in combination with one or more added dedicated antenna or input receiving electronics.

Also, embodiments described above employ processor electronics 40 for generating charts, reports, providing time and/or location information with detected energy levels (i.e., time and/or location stamp items of detected energy levels to correspond to the time and/or location at which the energy level was detected). However, in other embodiments, processes for generating charts, reports, associating time information and/or location information with energy levels is carried out by processing electronics associated with the server 18. In such embodiments, the mobile phone 12 communicates data corresponding to detected energy levels, time and/or location to the server 18. Also, in such embodiments, the server 18 may receive such information from multiple mobile phones 12, to generate charts, reports and other information associated with population of two or more (e.g., many) mobile phone users.

The specific orders or hierarchies of steps in the processes disclosed are exemplary approaches. Based upon design preferences, it is understood that the specific order or hierarchy of steps in the processes may be rearranged while remaining within the scope of the present disclosure. The accompanying method claims present elements of the various steps, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and some or all of the circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A mobile communication device comprising:
    a plurality of antennae on the mobile communication device configured to receive signals in a corresponding plurality of different frequency ranges, wherein each antenna on the mobile communication device is configured to receive signals in a frequency range that is different from the frequency range that each other antenna of the plurality of antennae is configured to receive;
    wireless receiver electronics configured to receive wireless communication signals through the plurality of antennae, in a plurality of different communication frequency bands that correspond to the plurality of different frequency ranges;
    electromagnetic wave energy level detection electronics configured to detect energy levels of electromagnetic waves received through the plurality of antennae in the plurality of different frequency ranges, each of the antennae being coupled to the electromagnetic wave energy level detection electronics and to the wireless receiver electronics; and
    processor electronics configured to provide at least one of:
        (a) a record of electromagnetic wave energy levels detected by the electromagnetic wave energy level detection electronics in the plurality of different frequency ranges, or (b) an alarm upon the electromagnetic wave energy levels detected by the electromagnetic wave energy level detection electronics in one or more of the plurality of different frequency ranges crossing a predefined threshold value.

2. A mobile communication device as recited in claim 1, further comprising additional signal receiving electronics for receiving wireless signals in at least one additional frequency range different from the plurality of different frequency ranges, wherein the electromagnetic wave energy level detection electronics is further configured to detect energy levels of electromagnetic waves in the at least one additional frequency range.

3. A mobile communication device as recited in claim 2, wherein the additional signal receiving electronics comprises at least one of a charging inductor configured to receive a power charging signal, a microphone or a speaker.

4. A mobile communication device as recited in claim 1, wherein the plurality of different communication frequency bands are within the plurality of different frequency ranges.

5. A mobile communication device as recited in claim 1, wherein the plurality of different frequency ranges is a plurality of different, non-overlapping frequency bands.

6. A mobile communication device as recited in claim 1, wherein the wireless receiver electronics is configured to receive wireless telephone communication signals in at least one of the plurality of different communication frequency bands.

7. A mobile communication device as recited in claim 1, wherein the processor electronics is configured to detect peak values of electromagnetic wave energy levels detected by the electromagnetic wave energy level detecting electronics.

8. A mobile communication device as recited in claim 7, wherein the processor electronics is further configured to compare detected peak values with at least one predefined threshold value.

9. A mobile communication device as recited in claim 7, wherein the processor electronics is further configured to provide an alarm signal upon a detected peak value exceeding a predefined threshold.

10. A mobile communication device as recited in claim 1, wherein the processor electronics is configured to determine an estimate of electromagnetic wave absorption by a user based, at least in part, on levels of electromagnetic waves detected by the electromagnetic wave energy level detection electronics.

11. A mobile communication device as recited in claim 10, wherein the processor electronics is configured to determine the estimate of electromagnetic wave absorption further based, at least in part, on user profile information including at least one of user's age, weight or gender.

12. A mobile communication device as recited in claim 1, wherein the processor electronics is configured to associate detected levels of electromagnetic waves with at least one of the detected locations or the detected times at which those levels of electromagnetic waves are detected.

13. A mobile communication device as recited in claim 1, further comprising GPS based location detection electronics for providing location information and wherein the processor electronics is configured to associate detected levels of electromagnetic waves with location information provided by the location detection electronics.

14. A mobile communication device as recited in claim 1, wherein the processor electronics is configured to detect the frequency of the received electromagnetic waves and to compare the detected frequencies with predetermined frequencies of known sources of electromagnetic waves to identify one or more potential sources of the received electromagnetic waves.

15. A method of operating a mobile communication device comprising:
arranging a plurality of antennae on the mobile communication device to receive communication signals and other electromagnetic waves, the plurality of antennae configured to receive signals in a corresponding plurality of different frequency ranges, wherein each antenna on the mobile communication device is configured to receive signals in a frequency range that is different from the frequency range that each other antenna of the plurality of antennae is configured to receive;
receiving wireless communication signals through the plurality of antennae, in a plurality of different communication frequency bands that correspond to the plurality of different frequency ranges;
detecting electromagnetic wave energy levels of electromagnetic waves received through the plurality of antennae in the plurality of different frequency ranges, each of the antennae being coupled to the electromagnetic wave energy level detection electronics and the wireless receiver electronics; and
providing at least one of: (a) a record of electromagnetic wave energy levels detected by the electromagnetic wave energy level detection electronics in the plurality of different frequency ranges, or (b) an alarm upon the electromagnetic wave energy levels detected by the electromagnetic wave energy level detection electronics in one or more of the plurality of different frequency ranges crossing a predefined threshold value.

16. A method as recited in claim 15, further comprising:
receiving wireless signals through additional signal receiving electronics not associated with the plurality of antennae, in at least one additional frequency range different from the plurality of different frequency ranges; and
detecting energy levels of electromagnetic waves in the at least one additional frequency range.

17. A method as recited in claim 16, wherein the additional signal receiving electronics comprises at least one of a charging inductor configured to receive a power charging signal, a microphone or a speaker.

18. A method as recited in claim 15, wherein the plurality of different communication frequency bands are within the plurality of different frequency ranges.

19. A method as recited in claim 15, further comprising receiving wireless telephone communication signals in at least one of the plurality of different communication frequency bands.

20. A method as recited in claim 15, wherein detecting electromagnetic wave energy levels comprises detecting peak values of electromagnetic wave energy levels received through the antennae in the plurality of different frequency ranges.

21. A method as recited in claim 20, further comprising comparing detected peak values with at least one predefined threshold value.

22. A method as recited in claim 20, further comprising providing an alarm signal upon a detected peak value exceeding a predefined threshold.

23. A method as recited in claim 15, further comprising determining an estimate of electromagnetic wave absorption by a user based, at least in part, on levels of electromagnetic waves detected by the electromagnetic wave energy level detection electronics.

24. A method as recited in claim 23, wherein determining the estimate of electromagnetic wave absorption is based, at least in part, on user profile information including at least one of user's age, weight or gender.

25. A method as recited in claim 24, further comprising associating detected levels of electromagnetic waves with at least one of the detected locations or the detected times at which those levels of electromagnetic waves are detected.

26. A method as recited in claim 15, further comprising providing GPS location information and associating detected levels of electromagnetic waves with the GPS location information.

27. A method as recited in claim 15, further comprising detecting the frequency of the received electromagnetic waves and comparing the detected frequencies with predetermined frequencies of known sources of electromagnetic waves to identify one or more potential sources of the received electromagnetic waves.

28. A mobile communication device comprising:
a plurality of signal receiving means on the mobile communication device for receiving signals in a corresponding plurality of different frequency ranges, wherein each signal receiving means on the mobile communication device is for receiving signals in a frequency range that is different from the frequency range each other of the signal receiving means is configured to receive;
wireless receiver means for receiving wireless communication signals through the plurality of signal receiving means, in a plurality of different communication frequency bands that correspond to the plurality of different frequency ranges;
means for detecting electromagnetic wave energy levels of electromagnetic waves received through the plurality of signal receiving means in the plurality of different frequency ranges, each of the antennae being coupled to the electromagnetic wave detecting means and the wireless receiver means; and
processor means for providing at least one of: (a) a record of electromagnetic wave energy levels detected by the electromagnetic wave energy detecting means in the plurality of different frequency ranges, or (b) an alarm upon the electromagnetic wave energy levels detected by the electromagnetic wave energy detecting means in one or more of the plurality of different frequency ranges crossing a predefined threshold value.

29. A mobile communication device as recited in claim 28, wherein the plurality of signal receiving means comprises a plurality of antennae.

30. A mobile communication device as recited in claim 29, wherein the plurality of signal receiving means further comprises at least one of a charging inductor configured to receive a power charging signal, a microphone or a speaker.

31. A computer program product for use in a mobile phone having a plurality of antennae on the mobile phone configured to receive signals in a corresponding plurality of different frequency ranges, wherein each antenna on the mobile phone is configured to receive signals in a frequency range that is different from the frequency range that each other antenna of the plurality of antennae is configured to receive, and electronics configured to receive wireless communication signals through the plurality of antennae, in a plurality of different communication frequency bands that correspond to the plurality of different frequency ranges, the computer program product comprising a non-transitory computer-readable storage medium comprising code for:
detecting electromagnetic wave energy levels of electromagnetic waves received through the plurality of antennae in the plurality of different frequency ranges, each of the antennae being coupled to electromagnetic wave energy level detection electronics and wireless receiver electronics; and providing at least one of: (a) a record of electromagnetic wave energy levels detected by the electromagnetic wave energy level detection electronics in the plurality of different frequency ranges, or (b) an alarm upon the electromagnetic wave energy levels detected by the electromagnetic wave energy level detection electronics in one or more of the plurality of different frequency ranges crossing a predefined threshold value.

32. The mobile communication device of claim 1, wherein the wireless receiver electronics comprise at least one first signal path for processing the wireless communication signals, and the electromagnetic wave energy level detection electronics comprise at least one further signal path for demodulating the electromagnetic waves, the at least one further signal path being different from the at least one first signal path.

33. The mobile communication device of claim 32, wherein the at least one further signal path comprises switching electronics configured to selectively connect one of the plurality of antennae to the electromagnetic wave energy level detection electronics.

34. The mobile communication device of claim 1, further comprising a plurality of sets of the electromagnetic wave energy level detection electronics, each set coupled to a different one of the plurality of antennae.

35. The mobile communication device of claim 1, wherein the electromagnetic wave energy level detection electronics comprise a variable band pass filter configured to vary a frequency range of the variable band pass filter depending on which one of the plurality of antennae that are configured to receive different frequency ranges is transmitting the electromagnetic waves to the electromagnetic wave energy level detection electronics.

* * * * *